United States Patent
Moore, Jr. et al.

(10) Patent No.: US 9,516,795 B2
(45) Date of Patent: Dec. 6, 2016

(54) PRINTED CIRCUIT BOARD COVER

(75) Inventors: Alston C. Moore, Jr., Boulder Creek, CA (US); Mark G. Siechen, Scotts Valley, CA (US)

(73) Assignee: Brocade Communications Systems, Inc, San Jose, CA (US)

( * ) Notice: Subject to any disclaimer, the term of this patent is extended or adjusted under 35 U.S.C. 154(b) by 0 days.

(21) Appl. No.: 13/558,321

(22) Filed: Jul. 25, 2012

(65) Prior Publication Data

US 2013/0176684 A1    Jul. 11, 2013

Related U.S. Application Data

(60) Provisional application No. 61/585,210, filed on Jan. 10, 2012.

(51) Int. Cl.
*H05K 9/00* (2006.01)
*H05K 7/20* (2006.01)

(52) U.S. Cl.
CPC ............. *H05K 9/0026* (2013.01); *H05K 7/20* (2013.01); *H05K 9/0028* (2013.01)

(58) Field of Classification Search
CPC ............. H05K 5/03; H05K 5/04; H05K 7/20; H05K 9/0026
USPC ................................. 361/818, 816, 688–723
See application file for complete search history.

(56) References Cited

U.S. PATENT DOCUMENTS

| | | | | |
|---|---|---|---|---|
| 5,508,889 A * | 4/1996 | Ii | ........................ | H05K 9/0028 174/368 |
| 6,185,099 B1 * | 2/2001 | Le Gal | .................... | H02J 7/025 165/80.4 |
| 6,239,359 B1 * | 5/2001 | Lilienthal, II | ....... | H05K 9/0028 174/370 |
| 6,462,436 B1 * | 10/2002 | Kay | ........................ | H04B 15/02 307/91 |
| 6,501,018 B2 * | 12/2002 | Mayer | .................. | H05K 9/0015 174/370 |
| 7,262,369 B1 * | 8/2007 | English | ................... | H01L 23/04 174/370 |
| 7,351,107 B1 * | 4/2008 | Burlock | ............. | H01R 23/6873 361/752 |
| 7,355,857 B2 * | 4/2008 | Pirillis | ............... | H05K 7/20418 165/80.3 |

(Continued)

*Primary Examiner* — Zachary M Pape
*Assistant Examiner* — Douglas Burtner
(74) *Attorney, Agent, or Firm* — Bever, Hoffman & Harms, LLP

(57) ABSTRACT

A sheet metal cover for a printed circuit board (PCB) includes a plurality of legs continuous with a substantially planar elevated section. The legs are attached to the PCB, and electrical connections are provided between the legs and an internal ground plane of the PCB at the attachment locations. The sheet metal cover is thereby grounded, inhibiting the transmission of electromagnetic signals through the sheet metal cover. The elevated section of the sheet metal cover prevents select electronic devices on the PCB from being viewed or probed. Openings through the sheet metal cover allow heat sinks or heat generating electronic devices (e.g., inductors) to be exposed through these openings, thereby facilitating cooling of these elements by airflow. An electrically conductive gasket attached to the underside of the elevated section may contact the heat sinks, further minimizing the radiation of EMI emissions.

12 Claims, 8 Drawing Sheets

(56) References Cited

U.S. PATENT DOCUMENTS

| | | | | |
|---|---|---|---|---|
| 7,625,223 B1* | 12/2009 | Fogg | .................... | H05K 5/0247 |
| | | | | 361/715 |
| 2001/0053070 A1* | 12/2001 | Kitamura | ............. | H05K 9/0028 |
| | | | | 361/818 |
| 2002/0075664 A1* | 6/2002 | Perkins | ................ | H05K 3/3447 |
| | | | | 361/816 |
| 2003/0107881 A1* | 6/2003 | Muramatsu | .......... | H01Q 1/1207 |
| | | | | 361/818 |
| 2003/0136812 A1* | 7/2003 | Seidler | ................ | B23K 1/0016 |
| | | | | 228/179.1 |
| 2003/0169583 A1* | 9/2003 | Watanabe | ............ | H05K 9/0028 |
| | | | | 361/818 |
| 2003/0193794 A1* | 10/2003 | Reis | ...................... | H01L 23/552 |
| | | | | 361/816 |
| 2003/0223213 A1* | 12/2003 | Daoud | ................. | H05K 9/0026 |
| | | | | 361/818 |
| 2007/0071886 A1* | 3/2007 | Babb | .................... | H01L 23/552 |
| | | | | 427/96.3 |
| 2007/0103882 A1* | 5/2007 | Liang | ................... | H05K 9/0028 |
| | | | | 361/816 |
| 2008/0192446 A1* | 8/2008 | Hankofer | ............... | H05K 3/301 |
| | | | | 361/752 |
| 2009/0184405 A1* | 7/2009 | Lu | ......................... | H01L 23/552 |
| | | | | 257/660 |
| 2010/0097771 A1* | 4/2010 | Hsu | ...................... | H05K 9/0026 |
| | | | | 361/748 |
| 2010/0246143 A1* | 9/2010 | Dinh | .................... | H05K 9/0026 |
| | | | | 361/748 |

* cited by examiner

PRINTED CIRCUIT BOARD COVER

RELATED APPLICATION

This application claims priority from U.S. Provisional Patent Application 61/585,210, entitled "Printed Circuit Board Cover", which was filed on Jan. 10, 2012, and is incorporated by reference herein.

FIELD OF THE INVENTION

This invention relates to a method and structure for reducing radiated emissions emanating from a printed circuit board. The present invention can be adapted to a printed circuit board (that might otherwise require significant re-design) to reduce radiated electro-magnetic emissions. The present invention also restricts probing/viewing the underlying components and circuitry to meet Federal Information Processing Standard (FIPS) requirements.

RELATED ART

Radiated emissions emanating from individual components on a printed circuit board have previously been reduced by constructing a conductive "equal potential" enclosure (often referred to as a Faraday enclosure) around the component, and bonding the enclosure to the underlying reference ground plane(s). The effectiveness of reducing the radiated emissions depends upon completeness of the enclosure and bond connections to the ground plane(s), which must increase as the emission frequencies of concern increase.

An example of this approach has been employed previously by first providing a perimeter ground ring on the component side of the outer surface of the printed circuit board around the radiating component. It is necessary that the ground ring have frequent via stitches to the underlying ground plane(s), so that high frequency currents have a relatively short return path. The number of via stitches required increases, and the spacing between them decreases, as the frequencies of concern increase. In this manner, a conductive enclosure is formed around all surfaces of the component. Most often, the radiating components have an associated heat sink, so a continuous conductive bond between the ground ring and the heat sink must be constructed.

As the complexity of printed circuit boards has increased along with higher operating frequencies and smaller electronic packages containing many more connection points, the increased density of traces has made the above-described enclosure technique more challenging to implement, so this technique is not often used today. It would therefore be desirable to have an improved method and structure for reducing radiated emissions from a printed circuit board.

The Federal Information Processing Standard (FIPS) defines varying levels of physical security for electronic modules, including for example, a level that includes requirements for evidence of physical tampering, and a level that includes requirements for physical tamper-resistance (making it difficult for attackers to gain access to sensitive information contained in the module).

One conventional method for providing FIPS protection includes milling a solid aluminum block to include a large cavity that is shaped to fit over the electronic devices mounted on the upper surface of a printed circuit board. The milled aluminum block is attached to the printed circuit board, wherein a peripheral boundary of the milled aluminum block is placed into electrical contact with a ground trace that is exposed at the upper surface of the printed circuit board. The ground trace typically has a width of at least about ⅛ inch, and is exposed around the entire periphery of the upper surface of the printed circuit board, thereby ensuring good electrical contact with the milled aluminum block. The ground trace must be coupled to all underlying ground planes of the printed circuit board by the previously discussed distributed stitching. By placing the milled aluminum block into contact with the external surface ground traces of the printed circuit board, the milled aluminum block is grounded, thereby providing protection for electromagnetic interference (EMI). However, making the ground trace wide enough to ensure good contact with the milled aluminum block undesirably consumes layout area on the printed circuit board.

When attached to the printed circuit board, the milled aluminum block completely encloses all electronic devices on the upper surface of the printed circuit board, such that these electronic devices cannot be viewed or probed by an attacker. The milled aluminum block may also physically cover switches that are mounted on the printed circuit board, thereby providing tamper resistance to these switches. However, the milled aluminum block does not does not allow any airflow to reach these enclosed electronic devices, thereby undesirably limiting the cooling of these devices. In addition, the milled aluminum block is expensive in terms of both material and fabrication costs.

It would therefore be desirable to have an improved method and structure for obscuring electronic devices on a printed circuit board, and reducing radiated emissions from the printed circuit board, which overcome the above-described deficiencies of the prior art.

SUMMARY

Accordingly, the present invention provides a sheet metal cover for a printed circuit board. The sheet metal cover of the present invention can be fabricated inexpensively using conventional sheet metal processing techniques. The sheet metal cover includes a plurality of legs that support a planar elevated section. The legs of the sheet metal cover are attached to the printed circuit board, whereby the planar elevated section is supported over electronic devices mounted on the printed circuit board. The planar elevated section inhibits viewing and probing of the underlying electronic devices. In one embodiment, attachment elements (e.g., screws/bolts) extend through openings in the legs and into mounting holes in the printed circuit board to physically attach the sheet metal cover to the printed circuit board. In this embodiment, the legs of the sheet metal cover are placed in electrical contact with conductive elements that surround the mounting holes and extend from an upper surface of the printed circuit board to the internal ground planes of the printed circuit board. These conductive elements are only required at discrete locations on the printed circuit board (i.e., where the legs of the sheet metal cover contact the printed circuit board), and therefore do not adversely impact the required layout area of the printed circuit board. By grounding the sheet metal cover in the above-described manner, radiated electromagnetic emissions are reduced.

In accordance with one embodiment, one or more openings can be formed through the planar elevated section of the sheet metal cover, thereby exposing select elements mounted on the printed circuit board. For example, an opening through the planar elevated section of the sheet metal cover can be provided such that a heat sink or a heat generating electronic component (e.g., an inductor), extends through the opening (without contacting the sheet metal cover). Exposing a heat sink or inductor through the sheet metal cover advantageously allows the heat sink/inductor to be cooled by an airflow introduced over the resulting structure. Note that an exposed heat sink or inductor does not generally provide access that can be exploited by an attacker.

In one embodiment, an electrically conductive gasket is attached to the underside of the planar elevated section of the sheet metal cover. The gasket may be attached to the sheet metal cover by an electrically conductive bonding material. In one embodiment, the gasket extends into the openings formed through the planar elevated section of the sheet metal cover, and contacts the associated heat sink(s) (or electronic component(s)). An electrically conductive bonding material may attach the gasket to the associated heat sink (or electronic component). In this manner, the heat sink (or electronic component) is electrically coupled to the grounded sheet metal cover by the gasket material, advantageously reducing radiated electromagnetic emissions from the printed circuit board. In addition, the gasket provides an additional physical barrier that prevents an attacker from viewing/probing in the spaces between the heat sink (or electronic component) and the sheet metal cover.

The present invention will be more fully understood in view of the following description and drawings.

DETAILED DESCRIPTION

Figures 1A, 1B:
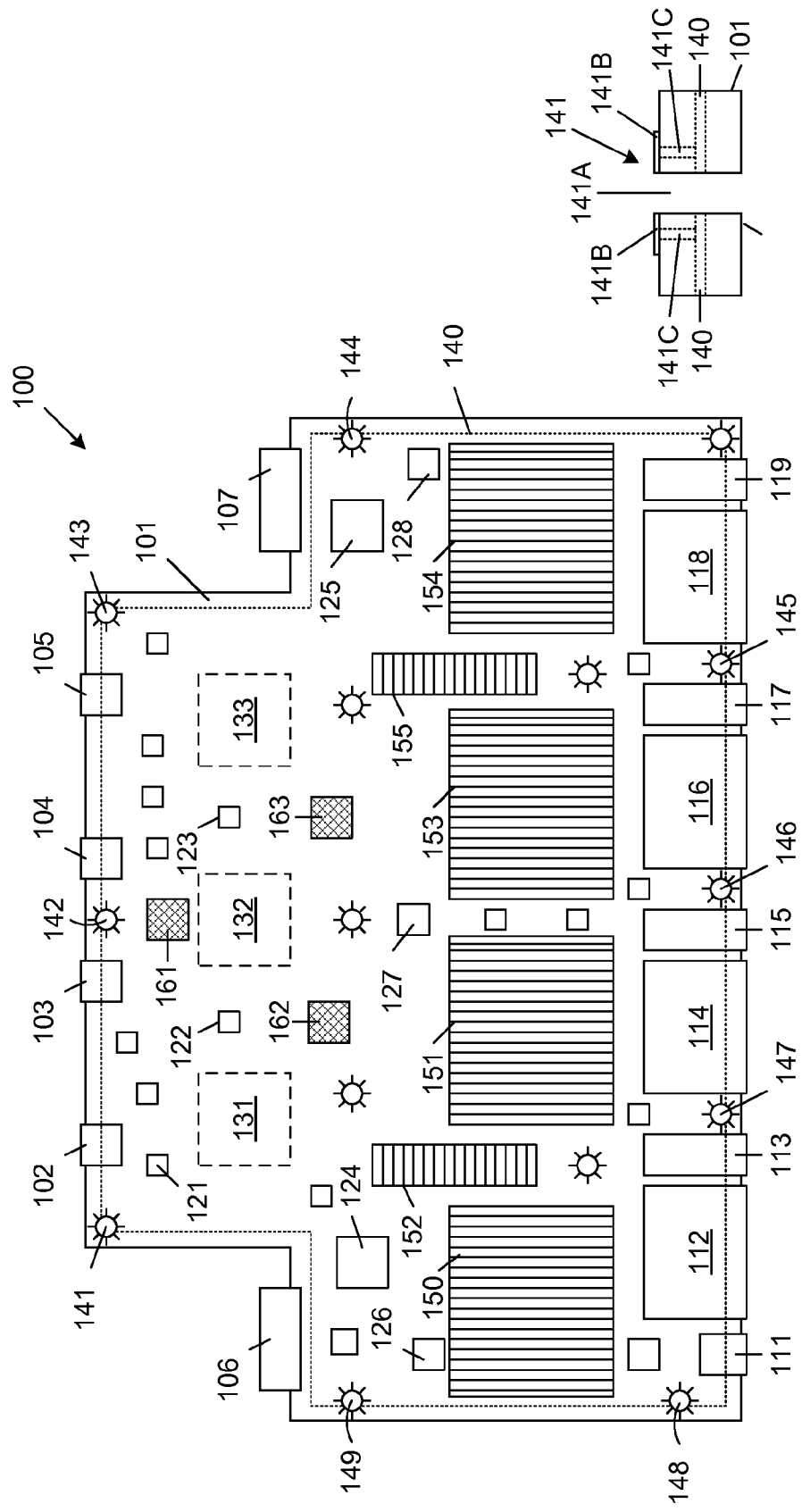
FIG. 1A is a top view of a printed circuit board module in accordance with one embodiment of the present invention.
FIG. 1B is a cross-sectional view of a mounting hole structure of the printed circuit board module of FIG. 1A in accordance with one embodiment of the present invention.

FIG. 1A is a top view of a printed circuit board (PCB) module 100 in accordance with one embodiment of the present invention. In the described embodiments, PCB module 100 is a network switching device. However, it is understood that the present invention can be implemented with other types of PCB modules. PCB module 100 includes printed circuit board 101, rear connector modules 102-107, front connector modules 111-119, top-surface mounted electronic devices 121-129, bottom-surface mounted electronic devices 131-133, internal ground plane 140, mounting hole structures 141-149, top-surface mounted heat sinks 150-155, and top-surface mounted inductors 161-163.

Rear connector modules 102-107 provide connections to traces within PCB 101, and are configured to engage with external connector modules (not shown) at the rear end of PCB 101. In one embodiment, rear connector modules 102-107 facilitate connections to a backplane and to one or more power supplies. Similarly, front connector modules 111-119 provide connections with traces within PCB 101, and are configured to engage with external connector modules (not shown) at the front end of PCB 101. In accordance with one embodiment, connector module 111 may provide a connection for a user interface, while connector modules 112-119 may provide interfaces for engaging Ethernet cables.

Electronic devices, such as ASICs, FPGAs and discrete electronic circuit elements, are mounted on the top and bottom surfaces of PCB 101 in a manner well known to those of ordinary skill. Electronic devices mounted on the top surface of PCB 101 are generally illustrated as squares having solid lines in FIG. 1A, while electronic devices mounted on the bottom surface of PCB 101 are illustrated as squares having dashed lines. Although there are many electronic devices mounted on the top and bottom surfaces of PCB 101, only top-surface mounted electronic devices 121-129 and bottom-surface mounted electronic devices 131-133 are labeled in FIG. 1. It is understood that heat sinks 150-155 are mounted on top of heat generating electronic devices (not shown in FIG. 1A), which are mounted on the top surface of PCB 101. Inductors 161-163, which generate significant amounts of heat during the normal operation of PCB module 100, are also mounted on the top surface of PCB 101.

Printed circuit board 101 includes internal ground planes 140, which stabilize a ground supply voltage reference to the various electronic devices mounted on PCB 101 in a manner known to those of ordinary skill in the art. Internal ground plane 140 is located between the upper and lower surfaces of PCB 101 (i.e., is not exposed at the upper/lower surfaces of PCB 101). Mounting hole structures 141-149 provide electrical connections to internal ground plane 140 in a manner described in more detail below.

FIG. 1B is a cross sectional view of mounting hole structure 141 in accordance with one embodiment of the present invention. It is understood that mounting hole structures 142-149 are substantially identical to mounting hole structure 141. Mounting hole structure 141 includes a mounting hole 141A that extends through PCB 101, electrically conductive pads 141B that surround the mounting hole 141A on the upper surface of PCB 101, and electrically conductive traces 141C that extend through PCB 101 to connect pads 141B to internal ground plane 140.

As described in more detail below, a connector element (e.g., screw) is inserted through the mounting hole 141A to attach a sheet metal cover 200 (FIG. 2, below) to the upper surface of PCB 101. In this configuration, the sheet metal cover is placed into electrical contact with electrically conductive pads, thereby grounding the sheet metal cover 200.

Note that mounting hole structures in addition to mounting hole structures 141-149 are included on PCB 101, but are not labeled with reference numbers for reasons of clarity.

In accordance with one embodiment, these additional mounting hole structures also provide electrical connections to internal ground plane 140.

Figure 2:
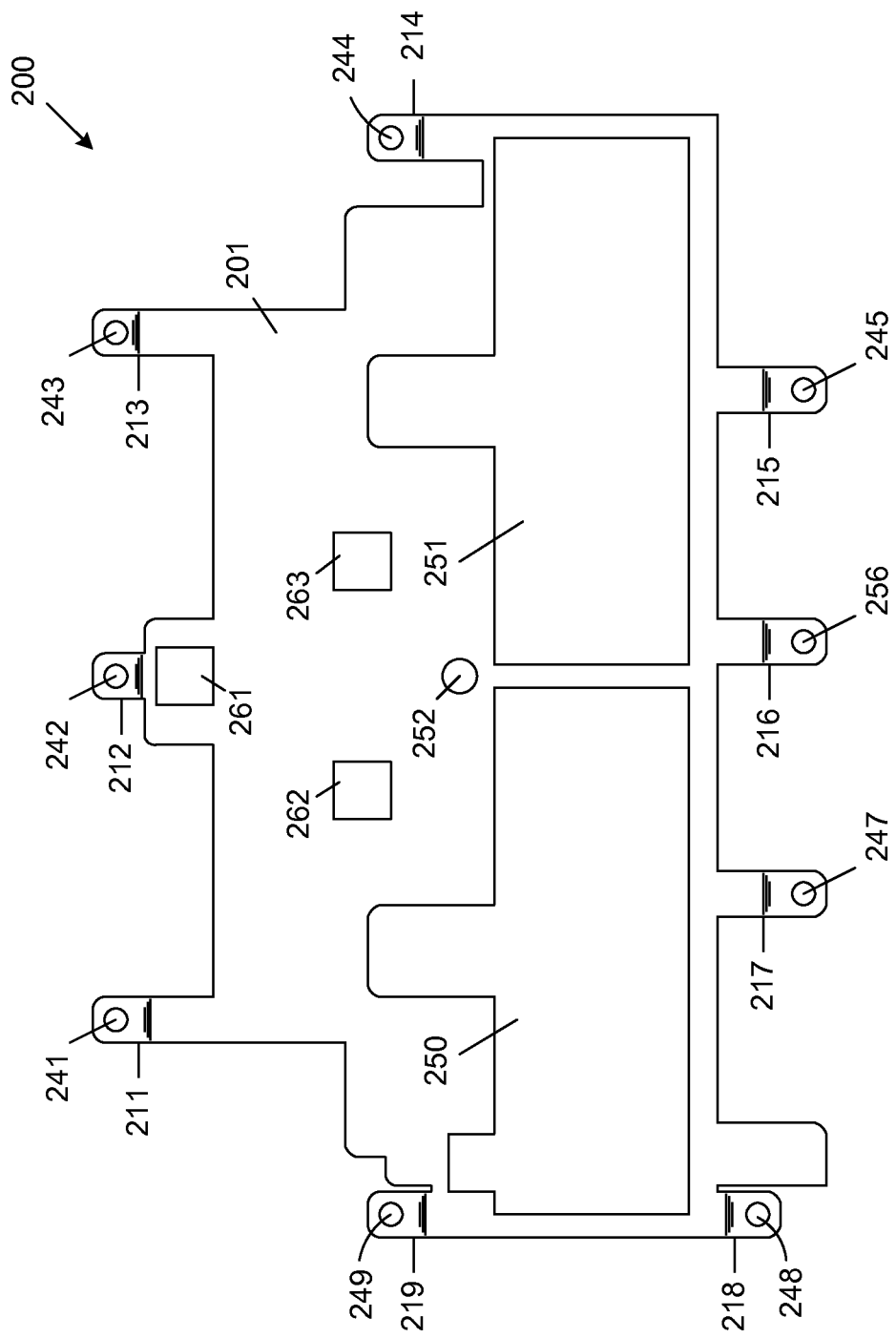
FIG. 2 is a top view of a sheet metal cover that is mounted over the printed circuit board module of FIG. 1A in accordance with one embodiment of the present invention.

FIG. 2 is a top view of a sheet metal cover 200 in accordance with one embodiment of the present invention. Sheet metal cover 200 includes a substantially planar elevated section 201 and legs 211-219. Mounting holes 241-249 are formed at the bottoms of legs 211-229, respectively. Openings 250-251 and 261-263 are formed through elevated section 201 as illustrated. As described in more detail below, mounting holes 241-249 are aligned with mounting hole structures 141-149, respectively, and connector elements (e.g., screws/bolts) are inserted to connect sheet metal cover 200 to PCB module 100. When aligned in this manner, heat sinks 150-152 and electronic module 126 are exposed through opening 250, and heat sinks 153-155 are exposed through opening 251. As described in more detail below, heat sinks 150-155 extend through openings 250-251 without contacting sheet metal cover 200. Similarly, inductors 161-163 are exposed through openings 261-263, respectively. Electronic device 127 is also exposed through opening 252.

Figure 3:
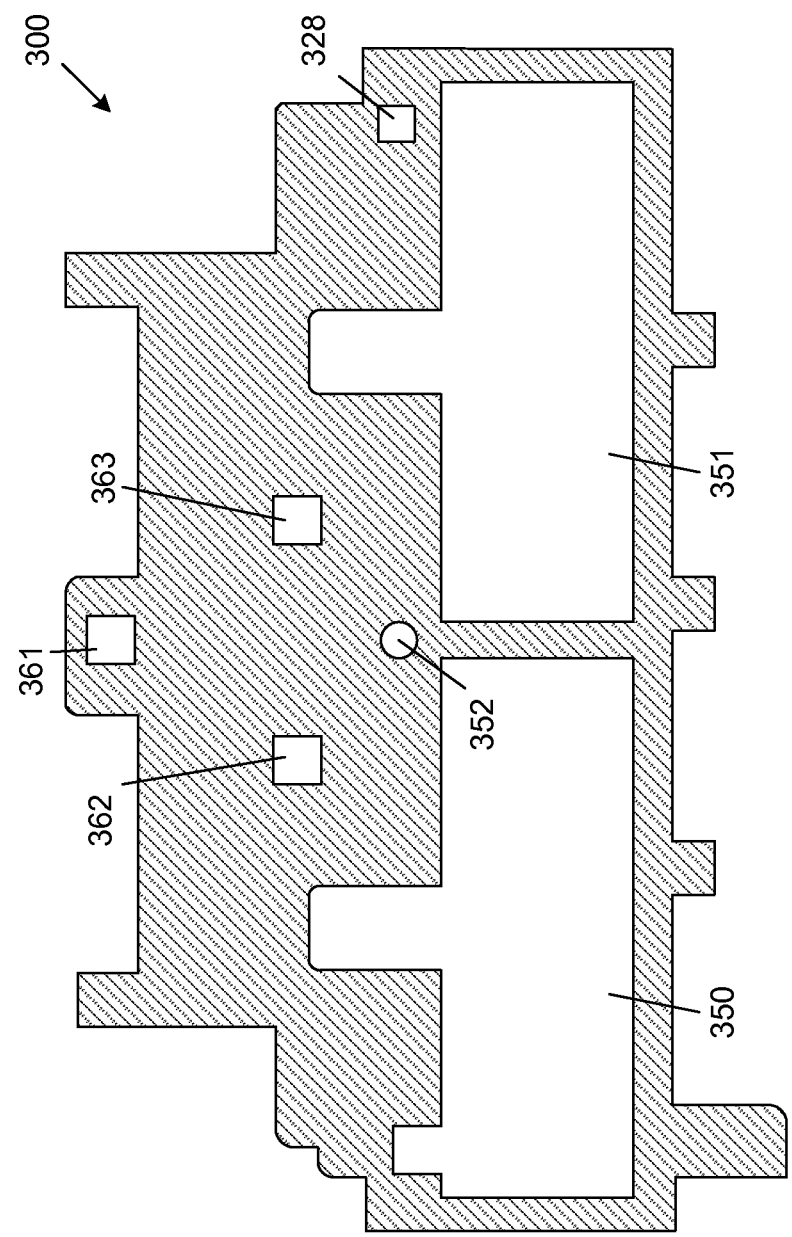
FIG. 3 is a top view of an electrically conductive EMI gasket that is attached to the sheet metal cover of FIG. 2 in accordance with one embodiment of the present invention.

FIG. 3 is a top view of an EMI gasket 300 in accordance with one embodiment of the present invention. Gasket 300 is constructed of a material that is electrically conductive. In one embodiment, gasket 300 is constructed of conventional fabric-over-foam EMI gasketing material (e.g., rip-stop nylon fabric with conductive nickel plated strands within the weave). Gasket 300 may alternately be constructed of other electrically conductive material such as beryllium copper (BeCu), sheet metal, copper tape or Mylar® coated/plated with an electrically conductive material. It is understood that other electrically conductive materials can be used to implement gasket 300 in other embodiments. Gasket 300 is dimensioned to fit under the elevated section 201 of sheet metal cover 200. Gasket 300 includes openings 328, 350-352 and 361-363. Generally, gasket 300 is attached to the underside of the elevated section 201 of sheet metal cover 200 by an electrically conductive adhesive (e.g., epoxy), such that openings 350-352 of gasket 300 are aligned with openings 250-252 of sheet metal cover 200, respectively. Openings 361-363 of gasket 300 are also aligned with openings 261-263, respectively, of sheet metal cover 200. As described in more detail below, the opening 328 of gasket 300 is aligned with electronic device 128 on PCB 101 when sheet metal cover 200 is mounted on PCB 101.

Figure 4:
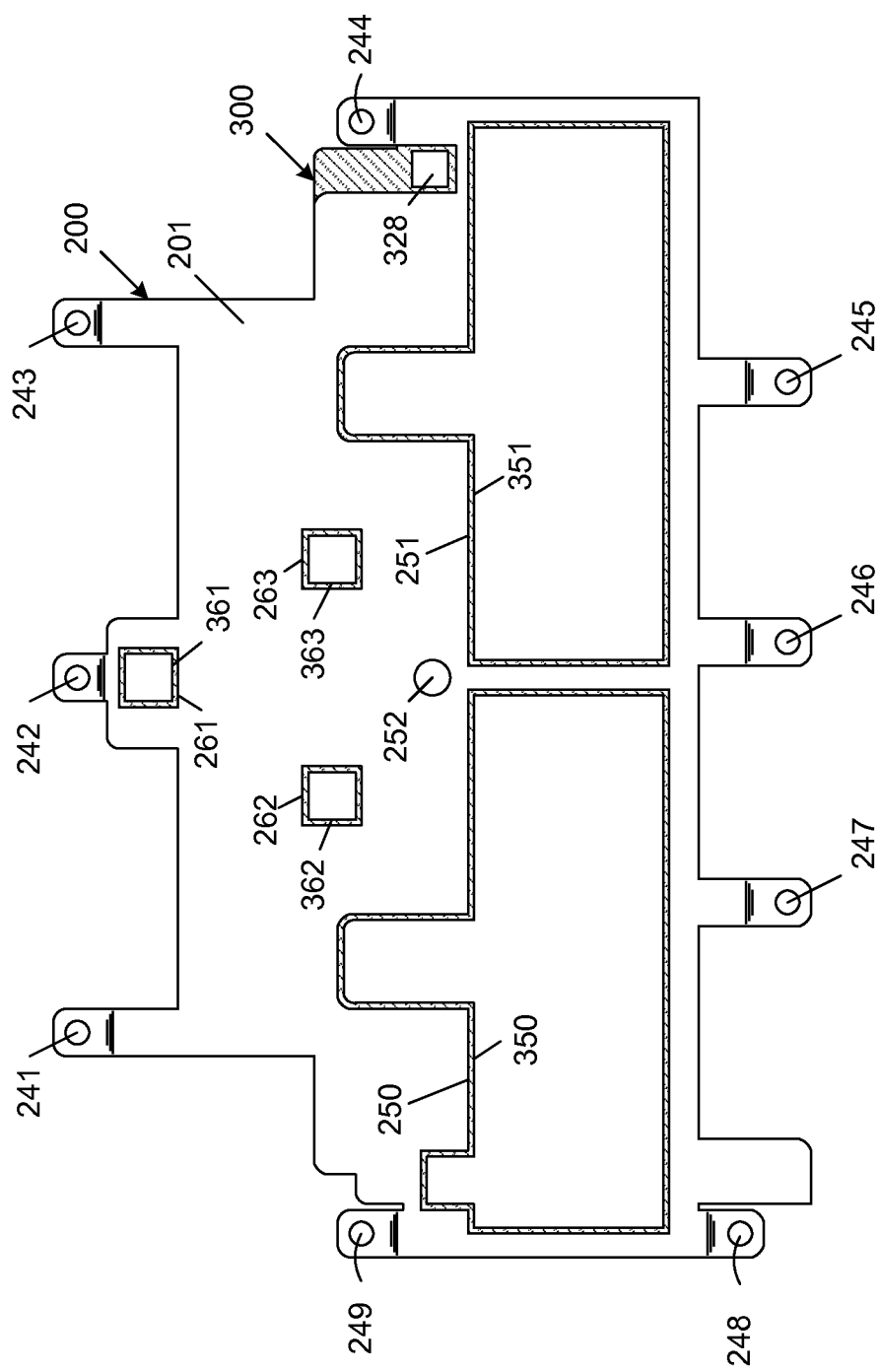
FIG. 4 is a top view illustrating the gasket of FIG. 3 attached to an underside of the sheet metal cover of FIG. 3 in accordance with one embodiment of the present invention.

FIG. 4 is a top view that shows gasket 300 mounted underneath the elevated section 201 of sheet metal cover 200, in accordance with one embodiment of the present invention. Note that gasket 300 is dimensioned such that portions of gasket 300 extend partially into openings 250-251 and 261-263, as illustrated. That is, the openings 350-351 and 361-363 in gasket 300 are slightly smaller than the corresponding openings 250-251 and 262-263 in sheet metal cover 200.

Figure 5:
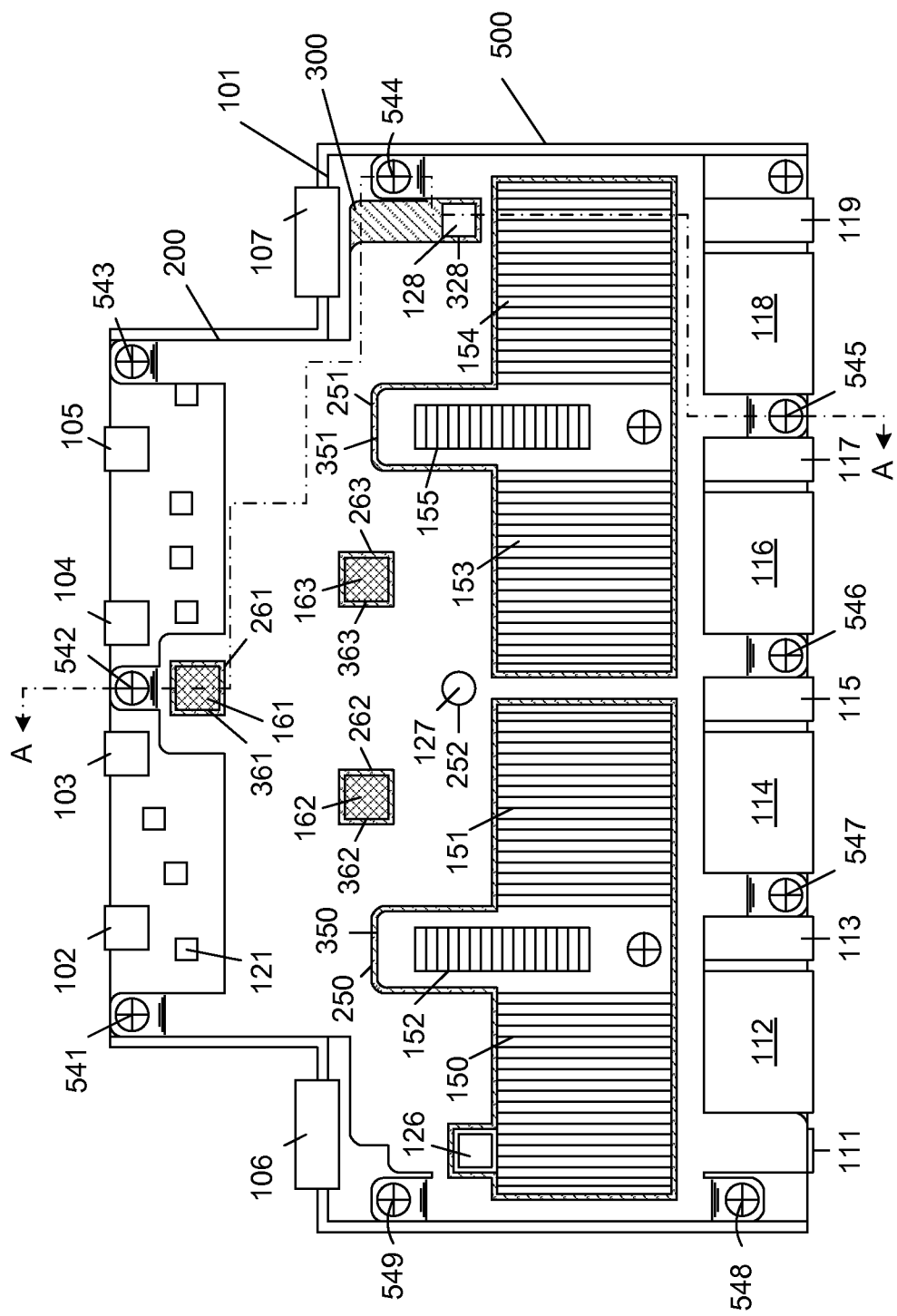
FIG. 5 is a top view that illustrates the sheet metal cover of FIG. 2 and the gasket of FIG. 3 attached to the printed circuit board module of FIG. 1 and an underlying tray in accordance with one embodiment of the present invention.
Figure 6:
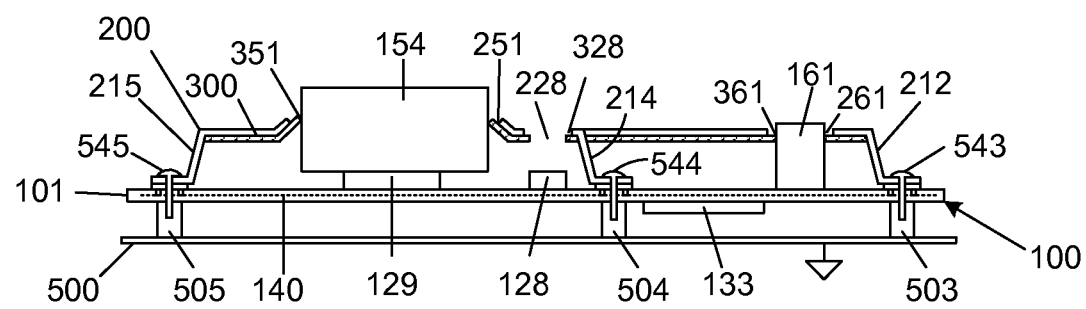
FIG. 6 is a cross-sectional view taken along section line A-A of FIG. 5.

FIG. 5 is a top view that illustrates sheet metal cover 200 and gasket 300 attached to PCB module 100 and an underlying tray 500 in accordance with one embodiment of the present invention. FIG. 6 is a cross-sectional view taken along section line A-A of FIG. 5. Note that FIG. 6 illustrates the electronic device 129 upon which heat sink 154 is mounted.

Screws 541-549 are inserted through the mounting holes 241-249, respectively, in sheet metal cover 200 and through the mounting hole structures 141-149, respectively, of PCB 101. Screws 541-549 engage with corresponding posts in the underlying tray 500. For example, as illustrated by FIG. 6, screws 543-545 engage with posts 503-505, respectively, of tray 500. As a result, PCB module 100 is suspended over (and attached to) tray 500. Screws 541-549 force sheet metal cover 200 into electrical contact with the electrically conductive pads of the mounting hole structures 141-149 of PCB 100 (e.g., pads 141B of FIG. 1B), thereby electrically coupling the sheet metal cover 200 to the internal ground plane 140. In one embodiment, tray 500 and the associated posts (e.g., posts 503-505) are electrically conductive (e.g., metal), and are also grounded. In one embodiment, screws 541-549 are also electrically conductive. Grounding sheet metal cover 200 in this manner advantageously reduces the radiated emissions exiting the smaller grounded cavities that are formed by the resulting assembly.

As illustrated by FIG. 5, heat sinks 150-152 and electronic device 126 are exposed through opening 250 of sheet metal cover 200 and opening 350 of gasket 300, and heat sinks 153-155 are exposed through opening 251 of sheet metal cover 200 and opening 351 of gasket 300. In accordance with one embodiment, the edges of gasket 300 that define openings 350 and 351 are placed in physical and electrical contact with associated heat sinks. For example, as illustrated by FIGS. 5 and 6, edges of gasket 300 are placed into contact with heat sinks 150-154. An electrically conductive adhesive can be used to attach the edges of gasket 300 to the heat sinks 150-154. As a result, the electrically conductive gasket 300 further reduces the transmission of electromagnetic energy through the cover.

Figure 7:
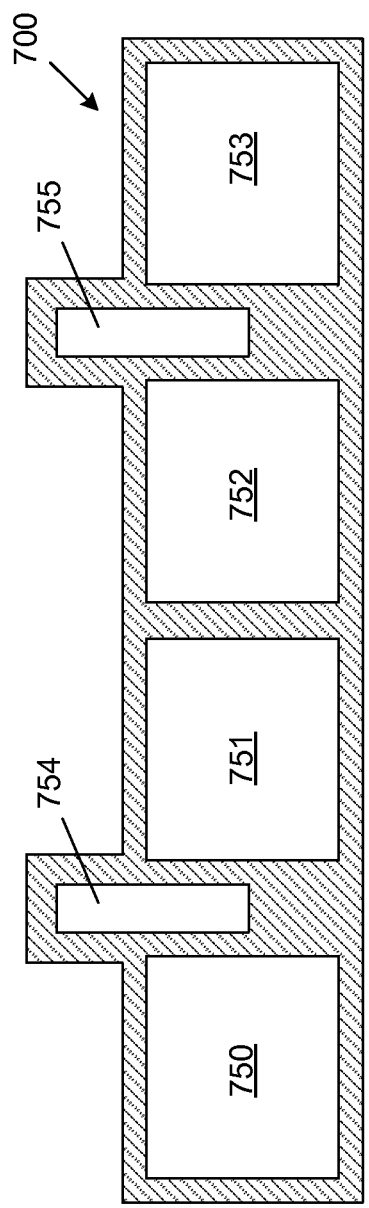
FIG. 7 is a top view of an electrically conductive EMI gasket, which can be used to replace the gasket of FIG. 3 in accordance with an alternate embodiment of the present invention.

FIG. 7 is a top view of an electrically conductive gasket 700, which can be used to replace gasket 300 in accordance with an alternate embodiment of the present invention. Gasket 700 includes openings 750-755, which are dimensioned and positioned to engage with each of the edges of heat sinks 150-155, respectively. Gasket 700 is attached to the underside of sheet metal cover 200 in the manner described above, such that openings 750-752 are exposed through opening 250 in sheet metal cover 200, and openings 753-755 are exposed through opening 251 of sheet metal cover 200.

Figure 8:
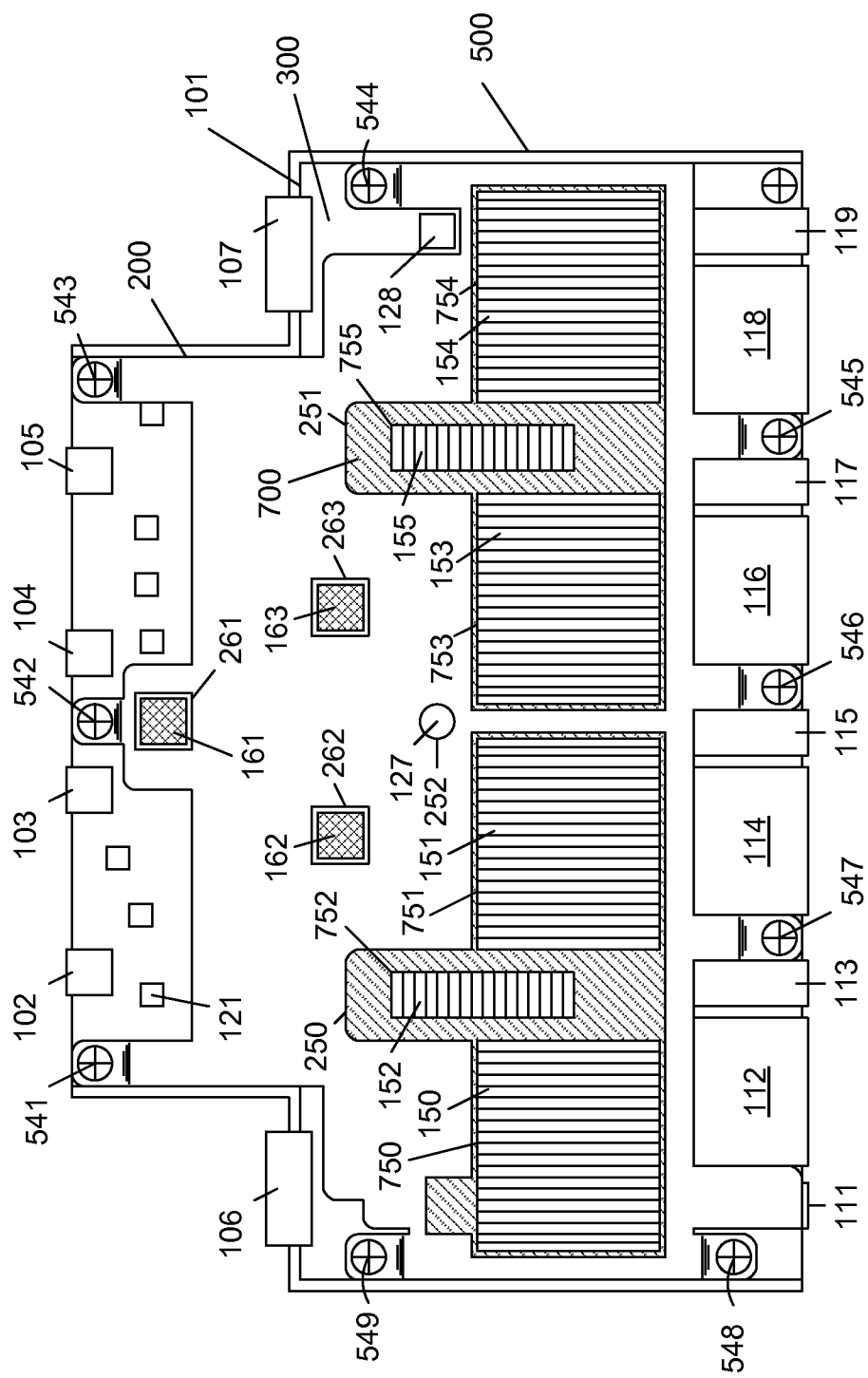
FIG. 8 is a top view that illustrates sheet metal cover of FIG. 2 and the gasket of FIG. 7 attached to the printed circuit board module of FIG. 1 and an underlying tray in accordance with one embodiment of the present invention.

FIG. 8 is a top view that illustrates sheet metal cover 200 and gasket 700 attached to PCB module 100 and underlying tray 500 in accordance with the present embodiment. Electrically conductive gasket 700 laterally surrounds and electrically contacts each of the edges of heat sinks 150-155, thereby further reducing the transmission of electromagnetic energy through the cover structure. Again, an electrically conductive adhesive can be used to connect gasket 700 to heat sinks 150-155.

In the embodiment illustrated by FIGS. 7 and 8, gasket material is only present at locations near where the gasket 700 is placed into electrical contact with the heat sinks 150-155. However, it is understood that in other embodiments, the coverage provided by gasket 700 can be extended. For example, the gasket 300 of FIG. 3 can be modified by replacing the openings 350-351 with openings similar to the openings 750-755 of gasket 700.

Returning now to FIGS. 5-6, inductors 161-163 are exposed through openings 261-263, respectively, of sheet metal cover 200 and through openings 361-363, respectively, of gasket 300. Electronic device 127 is exposed through opening 252 of sheet metal cover 200 and opening 352 of gasket 300. Electronic device 128 is exposed through opening 328 of the electrically conductive EMI gasket 300. Exposing heat sinks 150-155, inductors 161-163 and electronic devices 126-128 in the above-described manner advantageously facilitates the transfer of heat away from these elements. That is, airflow introduced across the resulting structure will advantageously provide direct cooling of heat sinks 150-155, inductors 161-163 and electronic devices 126-128.

Sheet metal cover 200 and gasket 300 physically cover selected electronic devices (e.g., electronic devices 122-125) on the upper surface of PCB module 100, thereby preventing probing/viewing of these electronic devices. In general, devices that emit large quantities of heat, but do not expose sensitive signals (e.g., heat sinks and inductors) are exposed through openings of sheet metal cover 200, while electronic devices that transmit or receive sensitive/critical signals (e.g., electronic devices 122-125) are covered by sheet metal cover 200.

Note that while the lower surface of the gasket 300 is close enough to the underlying electronic devices to prevent probing/viewing of these devices, there is a small gap between the gasket 300 and these underlying devices, thereby allowing some airflow to reach (and cool) these electronic devices.

Sheet metal cover 200 is inexpensive to fabricate, using conventional sheet metal processing techniques (e.g., stamping and pressing).

As mentioned above, grounded sheet metal cover 200 advantageously limits electromagnetic radiation from PCB module 100. In particular, the electronic devices 131-133 mounted on the lower surface of PCB 101 tend to emit electromagnetic signals, from the radiating component(s) on the surface of PCB 101 during normal operation of PCB module 100. Grounded sheet metal cover 200 and gasket 300 significantly reduce the propagation of these electromagnetic signals, thereby reducing electromagnetic interference (EMI) with nearby devices/modules.

Although the present invention has been described in connection with several specific embodiments, it is understood that variations of these embodiments are considered to fall within the scope of the invention. For example, although the present invention has been described in connection with a sheet metal cover/gasket that covers/exposes certain portions of a particular PCB module, it is understood that the present invention can be readily modified to accommodate different PCB modules. Thus, the present invention is limited only by the following claims.

We claim:

1. A system comprising:
    a printed circuit board having a first set of one or more electronic devices mounted thereon;
    a sheet metal cover that includes a plurality of legs and an elevated section, wherein the plurality of legs and the elevated section are formed from a continuous piece of sheet metal, wherein the plurality of legs are coupled to the printed circuit board, and wherein the elevated section is positioned over the first set of one or more electronic devices when the plurality of legs are coupled to the printed circuit board;
    an opening in the elevated section of the sheet metal cover, wherein an element attached to the printed circuit board extends through the opening; and
    an electrically conductive gasket that contacts the sheet metal cover and the element that extends through the opening in the elevated section of the sheet metal cover, wherein the gasket extends partially into the opening in the elevated section of the sheet metal cover.

2. The system of claim 1, further comprising conductive elements that electrically connect the legs of the sheet metal cover to an internal ground plane of the printed circuit board, thereby grounding the sheet metal cover.

3. The system of claim 1, wherein the element comprises a heat sink.

4. The system of claim 1, wherein the element comprises an electronic device.

5. The system of claim 4, wherein the electronic device is an inductor.

6. The system of claim 1, wherein the gasket is attached to the elevated section of the sheet metal cover.

7. The system of claim 1, wherein the gasket is attached to the element that extends through the opening in the elevated section of the sheet metal cover.

8. The system of claim 1, wherein the element that extends through the opening in the elevated section of the sheet metal cover is a heat sink.

9. The system of claim 1, wherein the electrically conductive gasket is located between the elevated section and the first set of one or more electronic devices mounted on the printed circuit board.

10. The system of claim 1, wherein the plurality of legs are spaced apart from one another.

11. The system of claim 10, wherein the legs contact the printed circuit board at discrete locations on the printed circuit board.

12. The system of claim 1, wherein a gap exists between the elevated section and the electronic devices, thereby allowing an airflow to reach the electronic devices.

* * * * *